United States Patent
Yang et al.

(10) Patent No.: US 9,496,221 B2
(45) Date of Patent: Nov. 15, 2016

(54) METHOD FOR FORMING FUSE PAD AND BOND PAD OF INTEGRATED CIRCUIT

(75) Inventors: Tai-I Yang, Hsinchu (TW); Marcus Yang, Hsinchu (TW); Chih-Hao Lin, Hsinchu (TW); Hong-Seng Shue, Zhubei (TW); Ruei-Hung Jang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 709 days.

(21) Appl. No.: 13/531,743

(22) Filed: Jun. 25, 2012

(65) Prior Publication Data

US 2013/0341757 A1   Dec. 26, 2013

(51) Int. Cl.
*H01L 23/62*   (2006.01)
*H01L 23/525*   (2006.01)

(52) U.S. Cl.
CPC ... *H01L 23/5258* (2013.01); *H01L 2924/0002* (2013.01)

(58) Field of Classification Search
CPC ............ H01L 23/26; H01L 23/5256–23/5258
USPC ............... 438/132, 215, 281, 333, 601, 745; 257/529, E21.592, E23.149
See application file for complete search history.

(56) References Cited

U.S. PATENT DOCUMENTS

| | | | | |
|---|---|---|---|---|
| 5,312,768 | A * | 5/1994 | Gonzalez | ..................... 438/227 |
| 5,985,765 | A * | 11/1999 | Hsiao | ..................... H01L 24/02 257/E21.507 |
| 6,235,557 | B1 * | 5/2001 | Manley | ............... H01L 23/5258 257/E23.15 |
| 6,316,350 | B1 | 11/2001 | Eissa et al. | |
| 6,677,226 | B1 * | 1/2004 | Bowen | ............... H01L 23/5258 257/E23.02 |
| 6,911,386 | B1 * | 6/2005 | Lee | ..................... H01L 23/5258 257/E23.15 |
| 7,265,001 | B2 * | 9/2007 | Lee | ..................... H01L 23/5258 257/E23.15 |
| 2004/0266077 | A1 * | 12/2004 | Yeo | ..................... H01L 29/785 438/157 |

* cited by examiner

*Primary Examiner* — Kenneth Parker
*Assistant Examiner* — John Lin
(74) *Attorney, Agent, or Firm* — Eschweiler & Associates, LLC

(57) ABSTRACT

The present disclosure relates to a method of fabricating a semiconductor device. A semiconductor device includes a bond pad and a fuse layer. The bond pad includes a coating on an upper surface. A dielectric layer is formed over the bond pad and the fuse layer. A passivation layer is formed over the dielectric layer. An etch is performed to form a bond pad opening and a fuse opening. The etch is performed using only a single mask. The fuse opening defines a fuse window. The upper surface of the bond pad is exposed by substantially removing the coating from the entire upper surface.

20 Claims, 10 Drawing Sheets

METHOD FOR FORMING FUSE PAD AND BOND PAD OF INTEGRATED CIRCUIT

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

The various processing steps fall into a number of categories including deposition, removal, patterning, and modification of electrical properties (i.e., doping). Deposition is any process that grows, coats, or otherwise transfers a material onto the wafer. Some examples of deposition processes include physical vapor deposition (PVD), chemical vapor deposition (CVD), electrochemical deposition (ECD), molecular beam epitaxy (MBE) and atomic layer deposition (ALD). Removal processes are any that remove material from the wafer either in bulk or selectively and consist primarily of etch processes, either wet etching or dry etching. Chemical-mechanical planarization (CMP) is also a removal process used between levels.

Patterning is series of processes that shape or alter the existing shape of the deposited materials and is also referred to as lithography. In one example, a wafer is coated with a chemical called a photoresist. The photoresist is exposed by exposing select portions of the wafer to short wavelength light. The unexposed regions are washed away by a developer solution. After etching or other processing, the remaining photoresist is removed.

DETAILED DESCRIPTION

Figure 1A:
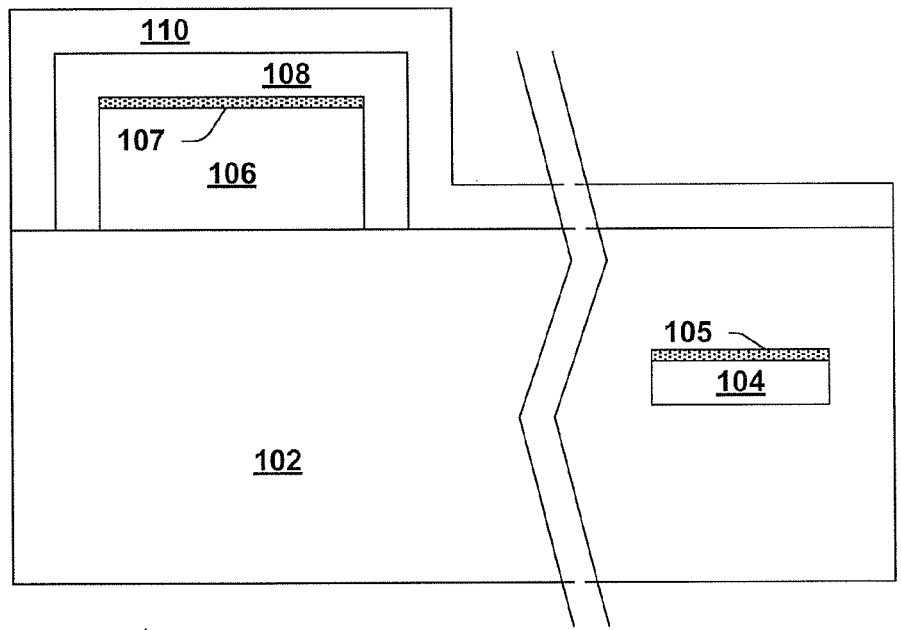
FIG. 1A is a cross sectional view of a semiconductor device at a stage of fabrication to illustrate bond pad exposure and fuse window formation.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Semiconductor fuses and bond pads are important components in many integrated circuits. The fuses are utilized to protect against over-current conditions and can limit short circuit current. Fuses mitigate damage due to current overload and short circuit conditions. Bonds or bond pads are located on the device and provide electrical connections to the circuits and devices formed therein. Bond pads are typically flat, large, metallic regions that are connected to package leads by way of bond wires or other connectors.

The fuses are bond pads are formed by a number of fabrication processes. In one example, they are fabricating using multiple masks. Masks are used in patterning process to define material to be removed. Using multiple masks requires added fabrication steps, which can slow down the fabrication process and/or increase cost and complexity.

Fuse etching is a process used to define the fuse window, such as for laser trim products. The fuse window and bond pad have different dielectric thicknesses to be defined. After a passivation etching process, the bond pad is clean on the surface of the metal, but the fuse window has a remaining portion of dielectric material. The passivation etching process removes passivation layers, such as anti reflective coatings (ARC), including materials such as Titanium-Nitride.

A first technique to obtain a fuse window and an exposed upper surface of the bond pad uses is to use two masks to perform separate etch processes for the bond pad and the fuse window. A second technique is to use a passivation layer, on the bond pad to obtain high selectivity for the bond pad and the remaining oxide of the fuse window. Then, a plasma treatment is utilized to remove the Titanium nitride on the bond pad. An example of the first technique, using two masks to define the bond pad and the fuse window, is described below in FIGS. 1A to 1F. An example of the second technique, using a selective etch process followed by a plasma treatment, is described below in FIGS. 2A to 2E.

FIG. 1A is a cross sectional view of a semiconductor device 100 at a stage of fabrication to illustrate bond pad exposure and fuse window formation. The device 100 is provided for illustrative purposes in order to facilitate an understanding of the disclosure. The semiconductor device 100 includes an oxide layer 102, a bond pad 106, and a fuse layer 104. The semiconductor device 100 requires removal of oxide and coatings from the bond pad 106 while maintaining a thickness of oxide above the fuse layer 104. The remaining thickness above the fuse layer 104 is also referred to as a fuse window.

The bond pad 106 is formed of a suitable conductive material, such as Al—Cu, Al—Si—Cu, metal, and the like. A coating 107, such as Titanium Nitride, is formed on an upper surface of the bond pad 106. The fuse layer 104 is also comprised of a suitable conductive material. Further, the fuse layer 104 also includes an anti reflective coating (ARC) 105 formed on an upper surface of the fuse layer.

An oxide layer 102 has been formed over and around the fuse layer 104 and the bond pad 106 is located over the oxide layer 102. Oxide is deposited or formed over the device 100 and forms a deposited oxide layer 108. A suitable oxide deposition or formation process can be utilized. A silicon nitride layer 110 is deposited or formed over the deposited oxide layer 108.

Figure 1B:
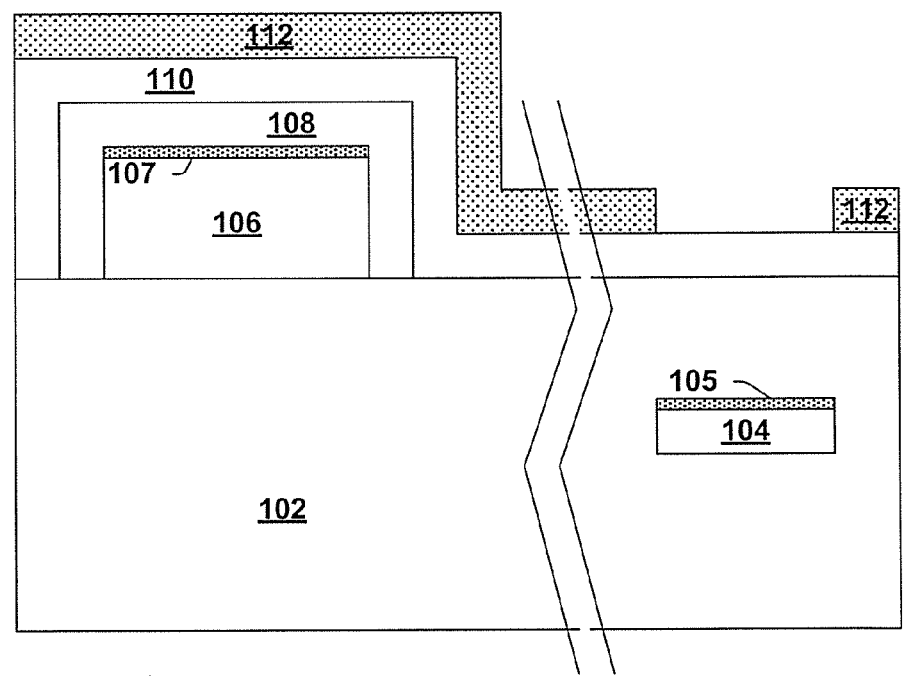
FIG. 1B is another cross sectional view of a semiconductor device at a stage of fabrication to illustrate bond pad exposure and fuse window formation.

FIG. 1B is another cross sectional view of a semiconductor device 100 at a stage of fabrication to illustrate bond pad exposure and fuse window formation. A layer of photoresist 112 is coated or deposited over the device 100. The layer of photoresist 112 is also referred to as a fuse resist layer. The photoresist 112 is exposed using a fuse mask or photomask and then developed. Once developed, a portion of the photoresist 112 above the fuse layer 104 is removed.

Figure 1C:
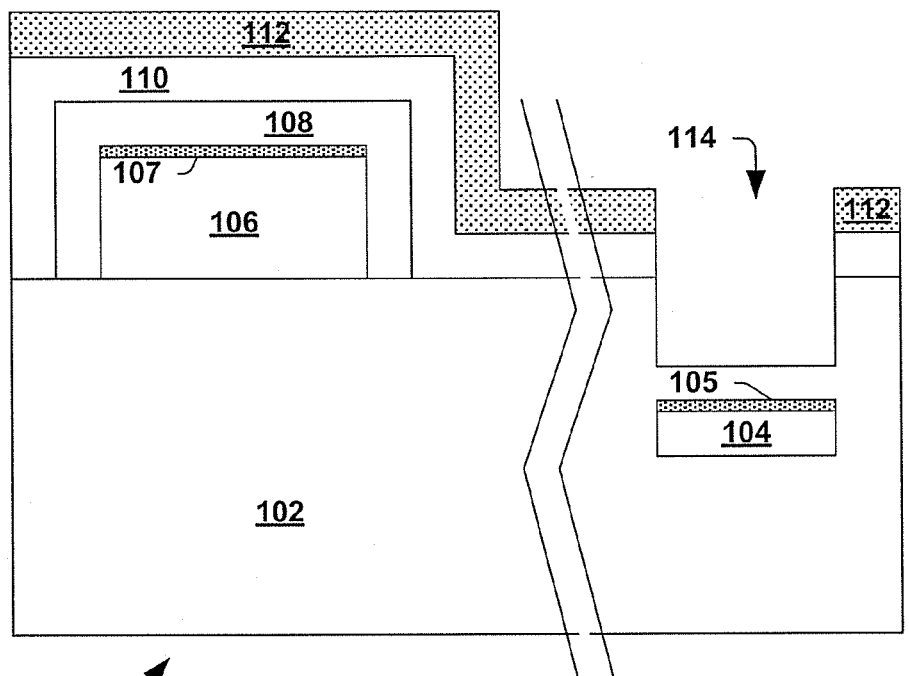
FIG. 1C is another cross sectional view of the semiconductor device at a stage of fabrication to illustrate bond pad exposure and fuse window formation.

FIG. 1C is another cross sectional view of the semiconductor device 100 at a stage of fabrication to illustrate bond pad exposure and fuse window formation. A fuse area etching process is performed that removes a portion of the oxide layer 102 above the fuse layer 104. An amount or thickness of the oxide layer 102 remains over the fuse layer and is referred to as the fuse window. However, it is noted that multiple layers and materials remain on the bond pad 106. After the fuse etching process is complete, the photoresist layer 112 is removed.

Figure 1D:
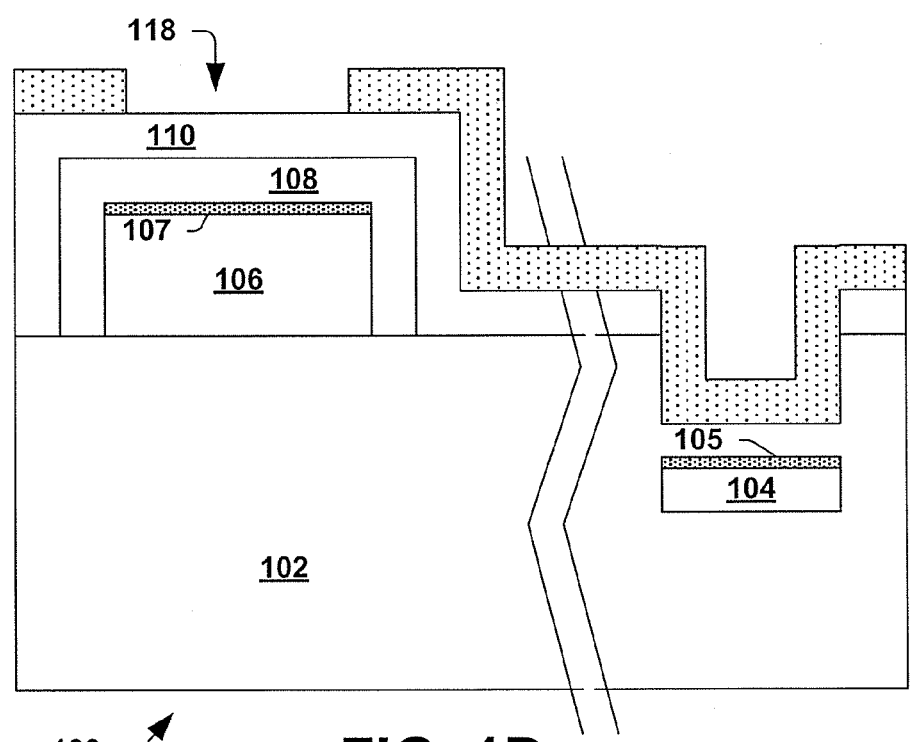
FIG. 1D is yet another cross sectional view of the semiconductor device at a stage of fabrication to illustrate bond pad exposure and fuse window formation.

FIG. 1D is yet another cross sectional view of the semiconductor device 100 at a stage of fabrication to illustrate bond pad exposure and fuse window formation. It can be seen that the photoresist layer 112 is no longer present. However, a second layer of photoresist 116 is coated or deposited over the device 100. The second layer of photoresist 116 is also referred to as a bond pad resist layer. The photoresist 116 is exposed and developed to create a bond mask. Once developed, a portion of the photoresist 116 above the bond pad 106 is removed.

Figure 1E:
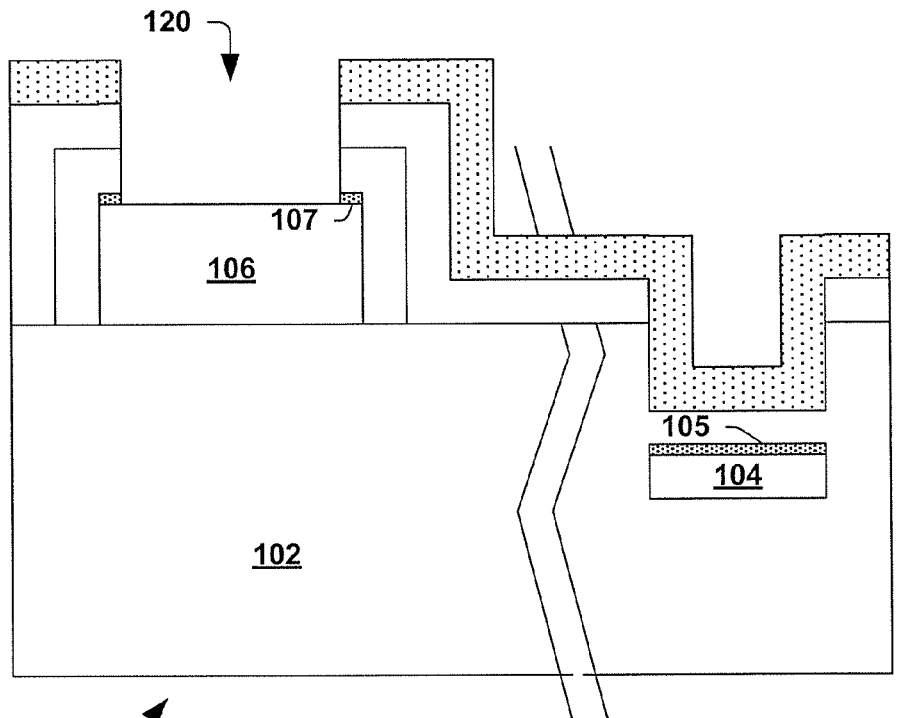
FIG. 1E is another cross sectional view of the semiconductor device at a stage of fabrication to illustrate bond pad exposure and fuse window formation.

FIG. 1E is another cross sectional view of the semiconductor device 100 at a stage of fabrication to illustrate bond pad exposure and fuse window formation. A bond area etching process is performed that removes a portion of the passivation layer 110 and a portion of the deposited oxide layer 108, both above the bond pad 106. The bond area etching process removes some, but not all, of the coating 107.

Figure 1F:
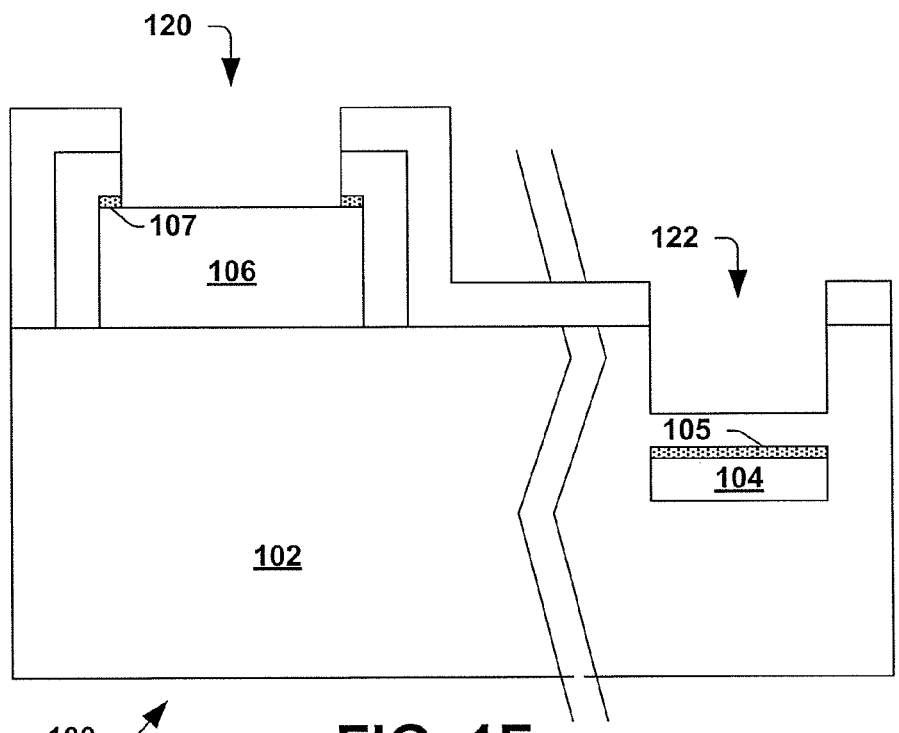
FIG. 1F is yet another cross sectional view of the semiconductor device at a stage of fabrication to illustrate bond pad exposure and fuse window formation.

FIG. 1F is yet another cross sectional view of the semiconductor device 100 at a stage of fabrication to illustrate bond pad exposure and fuse window formation. The second layer of photoresist 116 is removed. It is noted that portions of the coating 107 remain and are referred to as coating residue.

As a result, the device 100 is fabricated with the fuse window and an exposed upper layer of the bond pad 106. The use of multiple patterning processes permits control of the remaining oxide above the fuse layer 104. However, it is noted that multiple photoresist layers, masks, and etching processes, which are costly and time consuming to perform, are required in order to fabricate the semiconductor device 100. Other formation processes, including device packaging, connection of leads, and the like can also be performed.

Figure 2A:
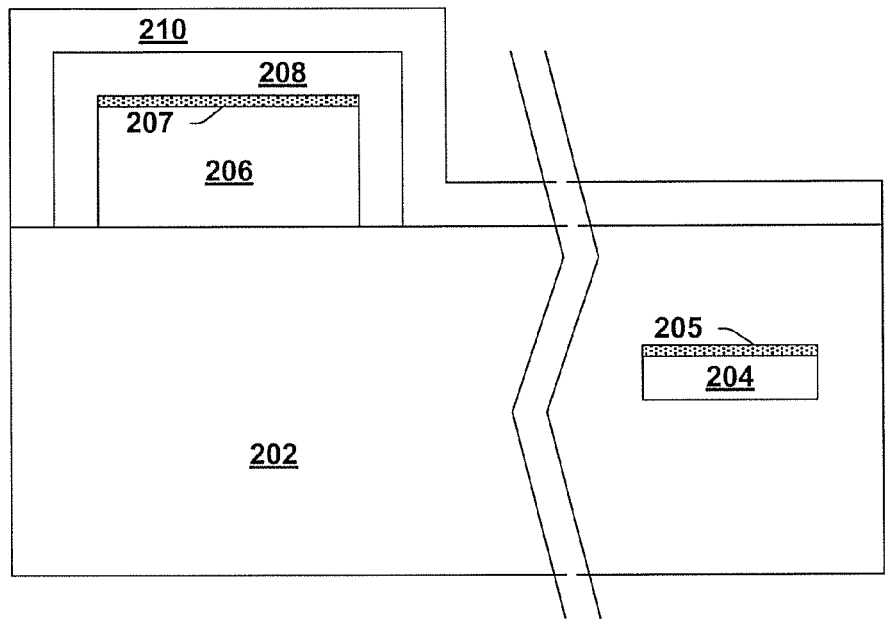
FIG. 2A is a cross sectional view of a semiconductor device at a stage of fabrication to illustrate bond pad exposure and fuse window formation.

FIG. 2A is a cross sectional view of a semiconductor device 200 at a stage of fabrication to illustrate bond pad exposure and fuse window formation. The device 200 is provided for illustrative purposes in order to facilitate an understanding of the invention. The semiconductor device 200 includes an oxide layer 202, a bond pad 206, and a fuse layer 204. The semiconductor device 200 requires removal of oxide and coatings from the bond pad 206 while maintaining a thickness of oxide above the fuse layer 204. The remaining thickness above the fuse layer 204 is also referred to as a fuse window.

The device 200 is to be formed using the second technique that uses a passivation layer, on the bond pad to obtain high selectivity for the bond pad and the remaining oxide of the fuse window. Then, a plasma treatment is utilized to remove the passivation layer from the bond pad. However, the plasma treatment removes an undesired amount of dielectric material from above the fuse layer.

The bond pad 206 is formed of a suitable conductive material, such as Al—Cu, Al—Si—Cu, metal, and the like. A coating 207 is formed on an upper surface of the bond pad 206. The fuse layer 204 is also comprised of a suitable conductive material. Additionally, the fuse layer 204 also includes an anti reflective coating (ARC) 205 formed on an upper surface of the fuse layer.

An oxide layer 202 has been formed over and around the fuse layer 204 and the bond pad 206 is located over the oxide layer 202. Oxide is deposited or formed over the device 200 and forms a deposited oxide layer 208. A suitable oxide deposition or formation process can be utilized. A passivation layer 210 is then deposited or formed over the deposited oxide layer 208. In one example, the passivation layer 210 includes a nitride material.

Figure 2B:
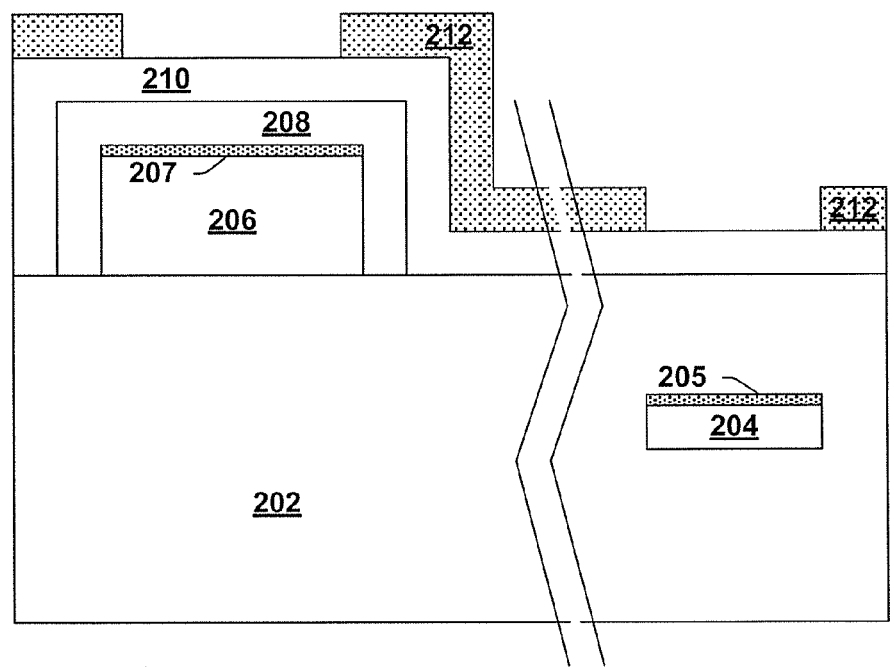
FIG. 2B is another cross sectional view of the semiconductor device at a stage of fabrication.

FIG. 2B is another cross sectional view of the semiconductor device 200 at a stage of fabrication. The view is provided to illustrate bond pad exposure and fuse window formation. A layer of photoresist 212 is coated or deposited over the device 200. The photoresist 212 is exposed using a mask or photomask and then developed. Once developed, a portion of the photoresist 212 above the fuse layer 204 and the bond pad 206 is removed.

Figure 2C:
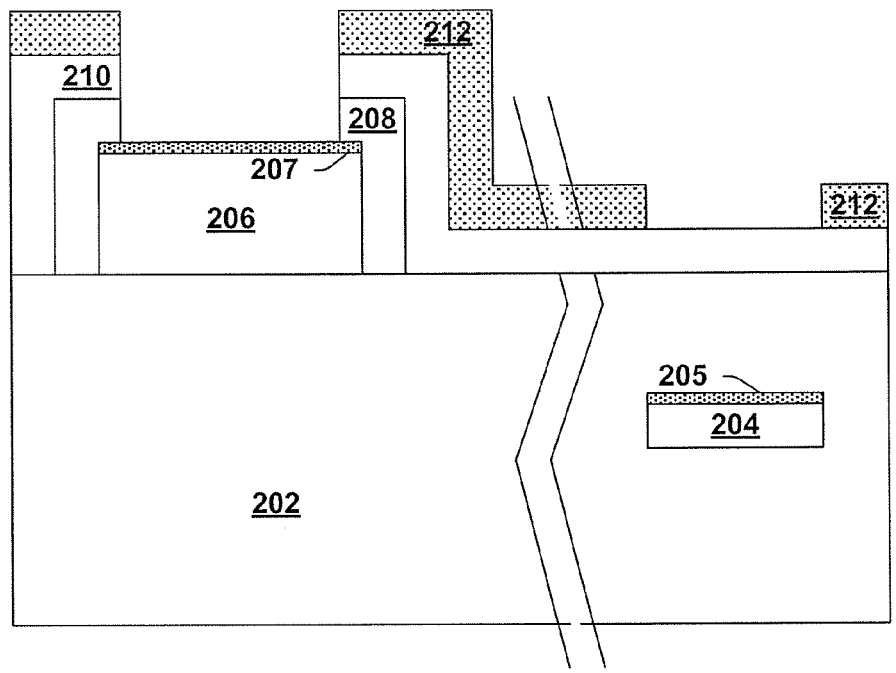
FIG. 2C is another cross sectional view of the semiconductor device at a stage of fabrication to illustrate bond pad exposure and fuse window formation.

FIG. 2C is another cross sectional view of the semiconductor device 200 at a stage of fabrication to illustrate bond pad exposure and fuse window formation. A selective etching process is performed that selectively removes a portion of the oxide layer 202 and the passivation layer 210 above the fuse layer 204 and a portion of the deposited oxide layer 208 and the passivation layer 210 above or over the bond pad 206. An amount or thickness of the oxide layer 202 remains over the fuse layer and is referred to as the fuse window. The coating 207 prevents etching of the bond pad 206 by having a material that is not readily etched via the selective etching process. In one example, the coating 207 is etched at a substantially slower rate than the oxide layer 202.

In another example, the coating 207 is not substantially etched by the selective etching process.

Figure 2D:
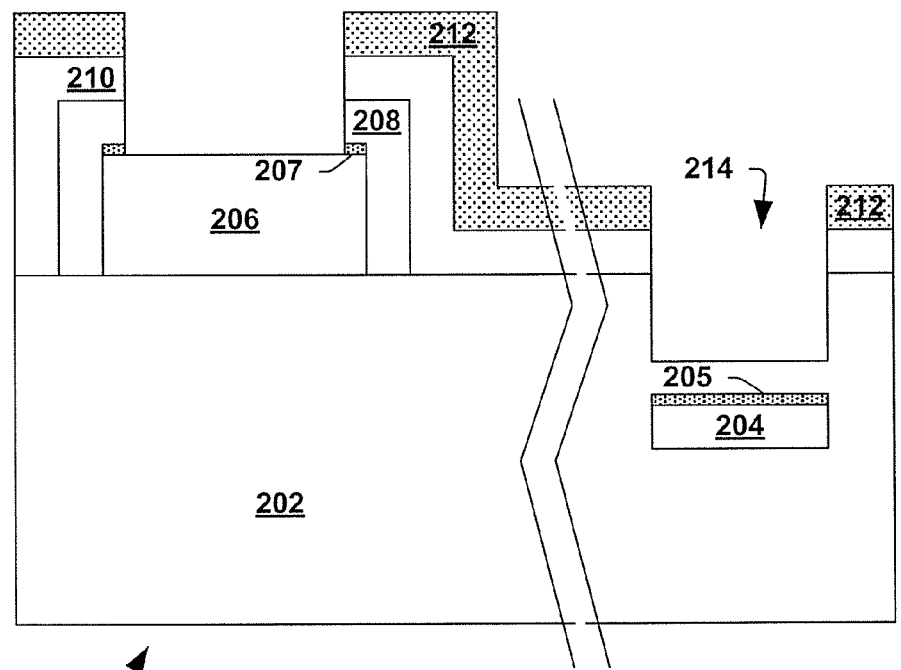
FIG. 2D is yet another cross sectional view of the semiconductor device at a stage of fabrication to illustrate bond pad exposure and fuse window formation.

FIG. 2D is yet another cross sectional view of the semiconductor device 200 at a stage of fabrication to illustrate bond pad exposure and fuse window formation. Before removal of the photoresist layer 212, a plasma etching process is used to remove the coating 207. This exposes an upper surface of the bond pad 206. However, the plasma etch undesirably removes a portion 214 of the oxide layer 202 above the fuse layer 204. Fuse performance is degraded or altered by the removed portion 214. Subsequently, the photoresist layer 212 is also removed or stripped.

Figure 2E:
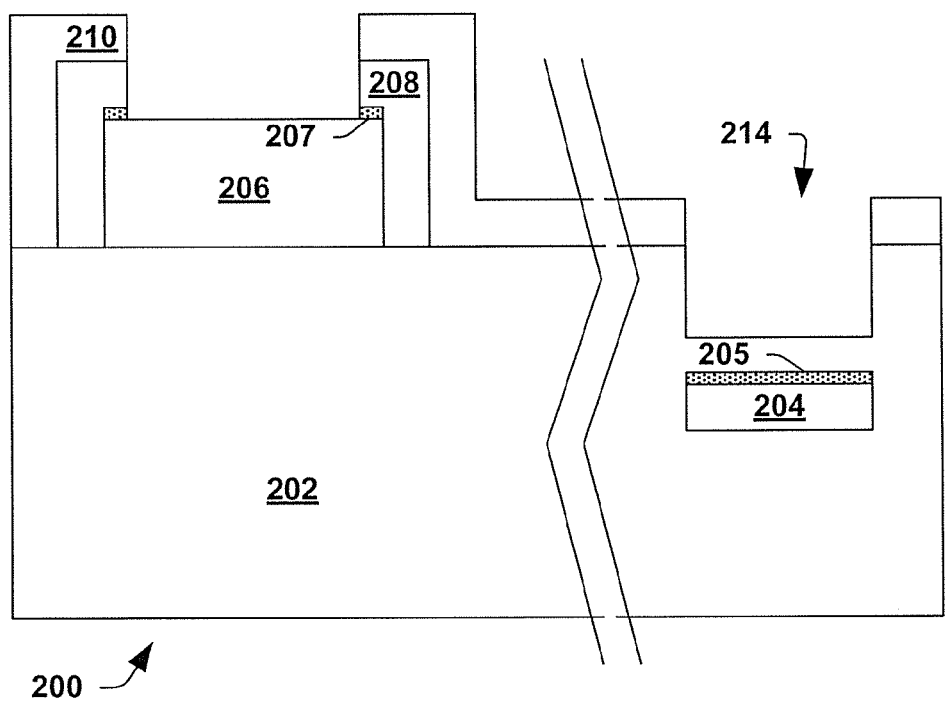
FIG. 2E is yet another cross sectional view of the semiconductor device at a stage of fabrication to illustrate bond pad exposure and fuse window formation.

FIG. 2E is yet another cross sectional view of the semiconductor device 200 at a stage of fabrication to illustrate bond pad 206 exposure and fuse window formation. Here, the passivation layer 210 is removed.

The device 200 is fabricated with the fuse window and an exposed upper layer of the bond pad 206. The device 200 was fabricated using a single mask to create the fuse window and the exposed upper layer of the bond pad. However, a separate plasma etch processing step is required to expose the upper layer of the bond pad 206. This extra step also results in the portion 214 of the oxide layer 202 to be removed. Additionally, portions of the coating 207 remain and are referred to as coating residue. Further, the plasma etch can leave remnant materials, such as fluorine, on the bond pad 206 afterward. Other formation processes, including device packaging, connection of leads, and the like can also be performed.

Figure 3:
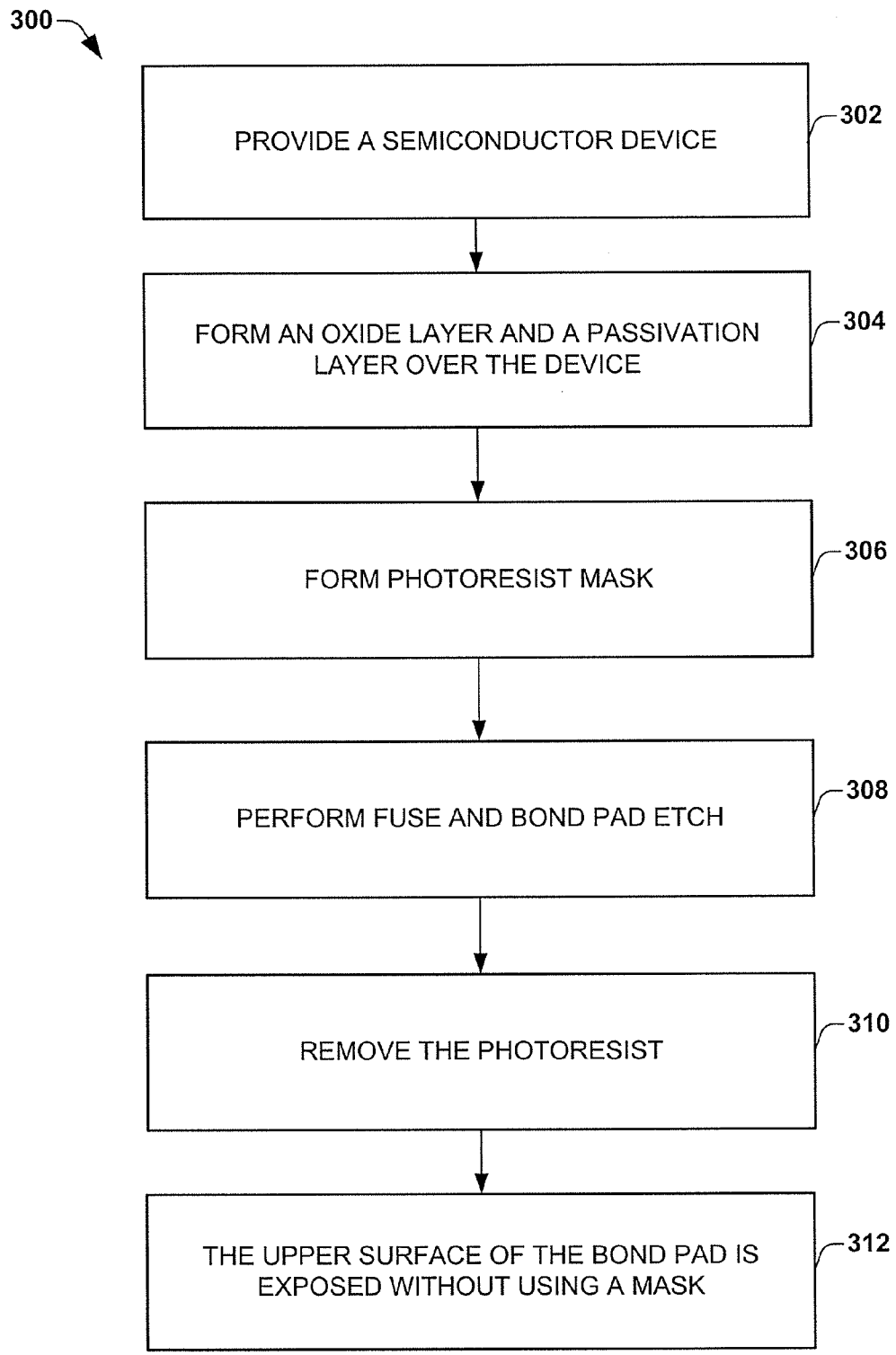
FIG. 3 is a flow diagram illustrating a method of fabricating a semiconductor device 400 having a fuse window and an exposed upper surface of a bond pad in accordance with some embodiments.

FIG. 3 is a flow diagram illustrating a method 300 of fabricating a semiconductor device 400 having a fuse window and an exposed upper surface of a bond pad in accordance with some embodiments. FIGS. 4A to 4E depict a semiconductor device at various blocks of the method 300. The method 300 is described with reference to FIGS. 4A to 4E in order to facilitate an understanding of the disclosure. It is appreciated that variations in the method 300 and in FIGS. 4A to 4E are contemplated.

Figure 4A:
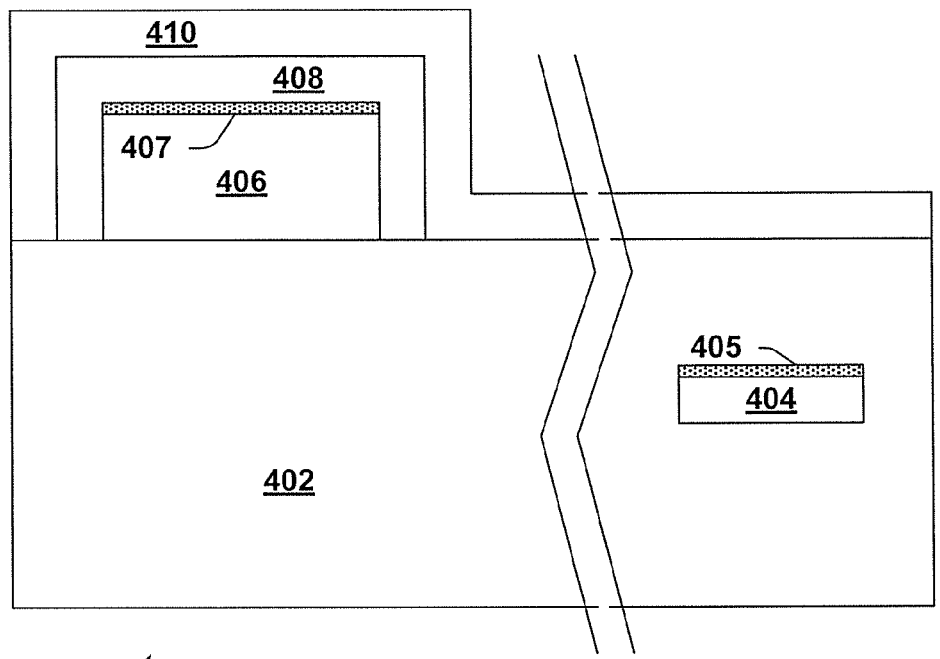
FIG. 4A is a cross sectional view of a semiconductor device at a first stage of fabrication in accordance with some embodiments.

FIG. 4A is a cross sectional view of a semiconductor device 400 at a first stage of fabrication in accordance with some embodiments. The method 300 begins at block 302, wherein the semiconductor device 400 is provided. The semiconductor device 400 includes an oxide layer 402, a bond pad 206, and a fuse layer 404. The bond pad 406 is located about or over the oxide layer 402. The fuse layer 404 is positioned within and is surrounded by the oxide layer 402.

In this example, the oxide layer 402 is comprised of silicon-dioxide ("oxide"). However, it is appreciated that alternative dielectric materials can be used for the oxide layer 402. The bond pad 406 is comprised of a suitable conductive material, such as Al—Cu, Al—Si—Cu, metal, and the like. The bond pad 406 can be utilized to electrically connect devices and circuits (not shown) within the device 400. For example, wires can be connected to the bond pad 406 and a package lead and provide an external connection to the device 400. The fuse layer 404 is also comprised of a suitable conductive material. The fuse layer 404 is coupled with an amount of a dielectric material to form a fuse. The fuse layer 404 is utilized to prevent or mitigate damage due to over current conditions and/or short circuit conditions. The fuse layer 404, thus, limits an amount of current or energy that can pass through thereby mitigating damage to circuits and components.

An anti reflective coating (ARC) 407 is formed on an upper surface of the bond pad 406. In one example, the ARC 407 is comprised of Titanium-Nitride. However, it is appreciated that alternate coatings can be utilized. Similarly, the fuse layer 404 also includes another anti reflective coating (ARC) 405 formed on an upper surface of the fuse layer 404. Alternate coatings can be used. Additionally, it is appreciated that the materials used for the coatings 405 and 407 can vary from each other.

The semiconductor device 400 requires removal of oxide and coatings from the bond pad 406 while maintaining a thickness of oxide above the fuse layer 404. The remaining thickness above the fuse layer 404 is also referred to as a fuse window.

An oxide layer 408 and a passivation layer 410 are formed over the device 400 at block 304. The oxide layer 408 is formed by a suitable process, such as an oxide deposition process. The oxide layer 408 if formed to have a selected thickness. In this example, the oxide layer 408 is comprised of oxide, however it is appreciated that other dielectric materials can be used instead of oxide. The passivation layer 410 is formed on or over the oxide layer 408. The passivation layer 410 is deposited by a suitable deposition process and is comprised of a suitable material. In one example, the passivation layer 410 is comprised of nitride, such as Titanium-Nitride.

Figure 4B:
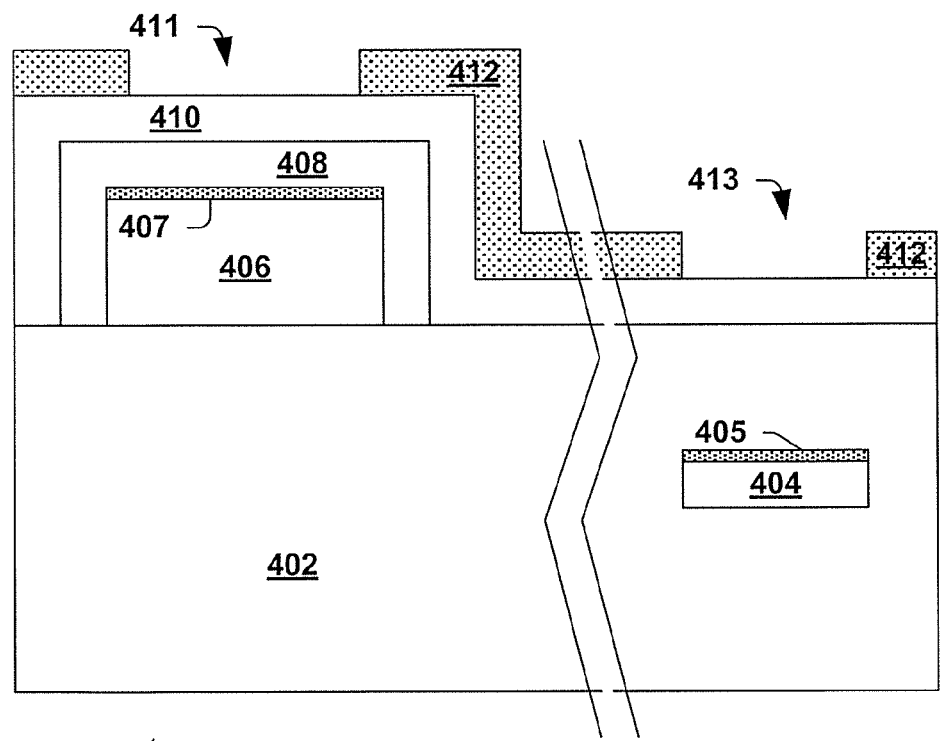
FIG. 4B is a cross sectional view of the semiconductor device at another stage of fabrication.

FIG. 4B is a cross sectional view of the semiconductor device 400 at another stage of fabrication. A photoresist mask is formed over the device 400 at block 306. A layer of photoresist 412 is formed over the device 400. The photoresist layer 412 is comprised of a light sensitive chemical. A suitable formation or coating process is utilized. In one example, the photoresist 412 is formed by dispensing the material onto the device 400 and then spinning the device 400 to form a uniform layer.

The layer of photoresist 412 is exposed to form a bond pad opening 411 and a fuse opening 413 in the layer of photoresist 412. The layer of photoresist 412 is exposed to a pattern of light such that portions of the layer 412 are exposed and other portions are not exposed. This is also referred to as developing. The exposure selects portions to be removed, for example, by a developer solution or other removal process. The selected portions are removed and form the bond pad opening 411 and the fuse opening 413. The remaining portions of the layer of photoresist 412 form the photoresist mask or resist mask.

Figure 4C:
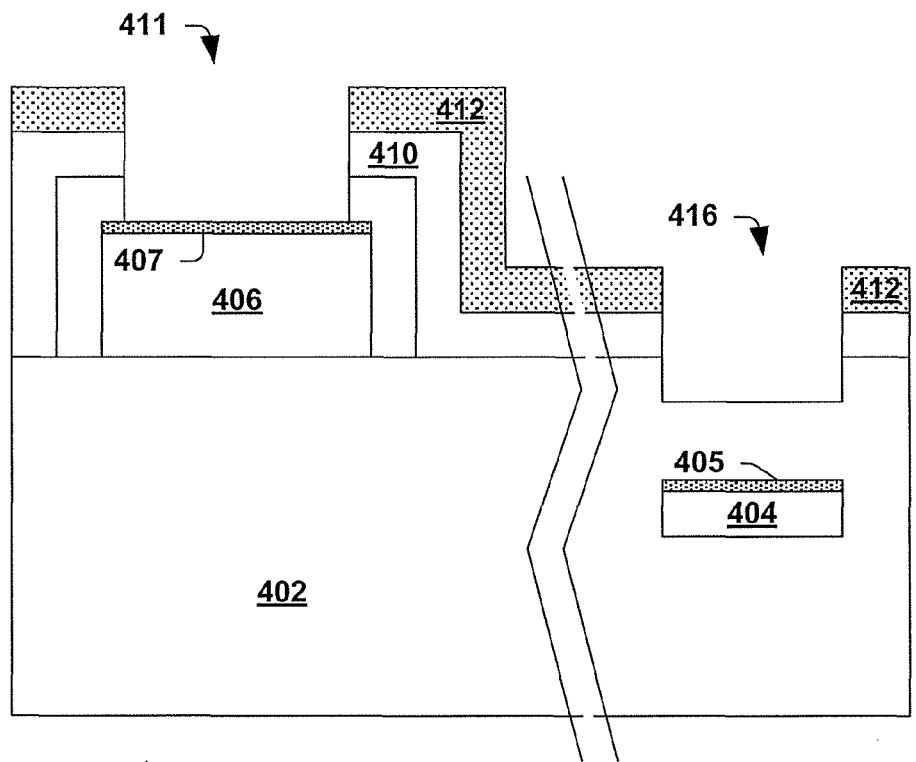
FIG. 4C is another cross sectional view of the semiconductor device at a stage of fabrication in accordance with some embodiments.

FIG. 4C is another cross sectional view of the semiconductor device 400 at a stage of fabrication in accordance with some embodiments. A fuse and bond pad passivation etch process is performed at block 308. The etch uses the photoresist mask formed from the layer of photoresist 412. The etch process simultaneously removes exposed portions of the oxide layers 408 and 402 and the passivation layer 410. The exposed portions are defined by the bond pad opening 411 and the fuse opening 413. A remaining portion of the oxide layer 402 above the fuse layer 404 is defined as a fuse window 416. The ARC 407 prevents etching of the bond pad 406 by having a material that is not readily etched via the etching process. In one example, the ARC 407 is etched at a substantially slower rate than the oxide layer 402. In another example, the ARC 407 is not substantially etched by the fuse and passivation etching process.

After completion of the passivation fuse etching process, the layer of photoresist 412 is removed at block 310. In one example, the layer 412 is removed by a suitable process, such as stripping or ashing.

Figure 4D:
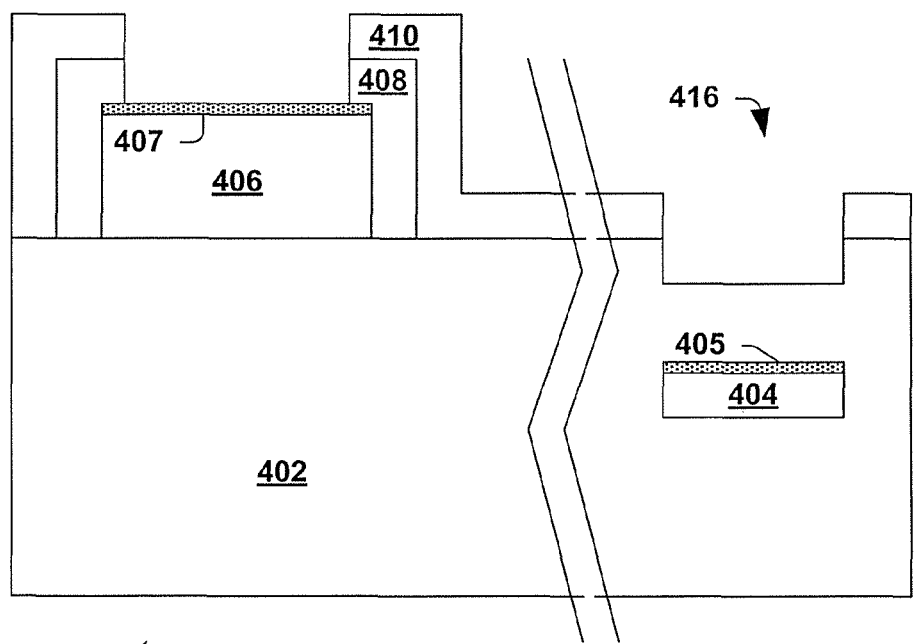
FIG. 4D is yet another cross sectional view of the semiconductor device at a stage of fabrication in accordance with some embodiments.

FIG. 4D is yet another cross sectional view of the semiconductor device 400 at a stage of fabrication in accordance with some embodiments. The fuse window 416 is formed, however the bond pad 406 is not yet exposed. This is because the ARC 407 remains on the upper surface of the bond pad 406. A mask-less bond pad "etch" or removal is performed to expose the upper surface of the bond pad 406 at block 312. The bond pad etch is performed without a resist mask and with a suitable solution or reagent that substantially removes the ARC 407, but does not substantially remove portions of the passivation layer 410 or portions of the fuse window 416. One example of a suitable solution includes hydrogen peroxide, which is used to remove the ARC 407, when comprised of TiN. It is appreciated that other suitable solutions are also be utilized. As a result, the upper surface of the bond pad 406 is exposed.

Figure 4E:
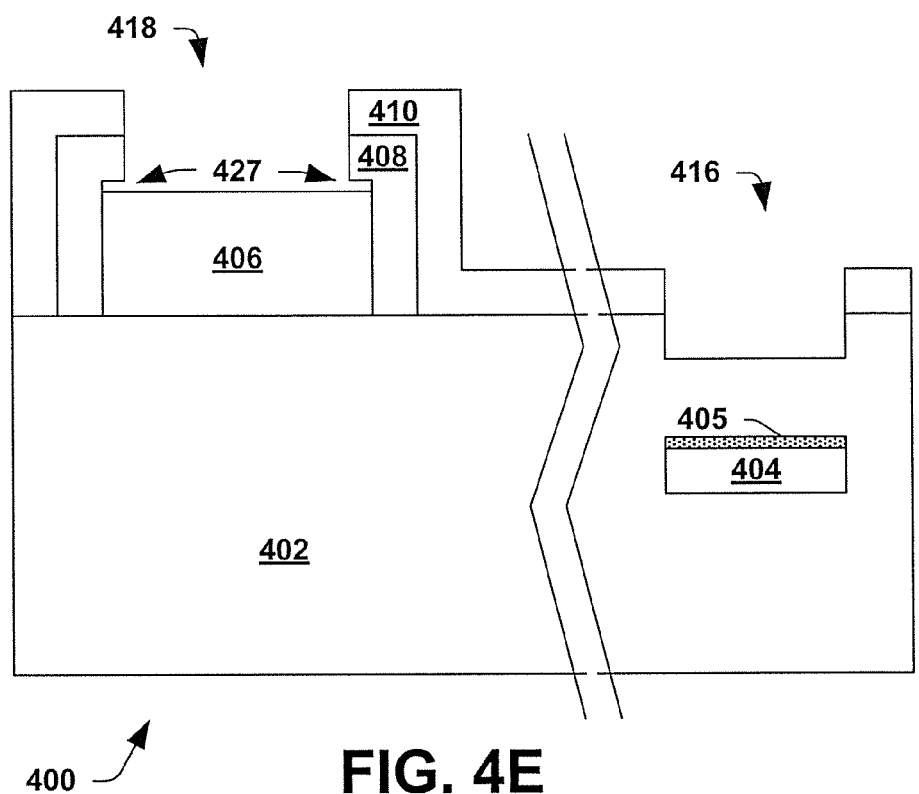
FIG. 4E is another cross sectional view of the semiconductor device at a stage of fabrication in accordance with some embodiments.

FIG. 4E is another cross sectional view of the semiconductor device 400 at a stage of fabrication in accordance with some embodiments. This view shows that the upper surface 418 of the bond pad 406 is exposed and that the fuse window 416 has been created. The solution used is a highly selective reagent that substantially removes the ARC 407 without any or substantially any loss of dielectric material over the fuse layer 404. Thus, even portions under the oxide layer 408 as shown at 427 are removed and no coating residue remains. As a result, the method 300 provides the exposed upper surface 418 of the bond pad 406 and the fuse window 416 with less processing steps, a reduced number of photolithography steps, and/or at a lower cost than conventional semiconductor fabrication techniques.

It is noted that the device 400 is fabricated by the method 300 using one mask to define the fuse window 416 and the bond pad area at the same time. The ARC 407 is selected to stop etching over the bond pad 406 while etching the fuse window 416. Further, the use of a plasma etch process to expose the bond pad 406 is avoided, which also prevents remnants from plasma etch processes from being left on the bond pad 406.

Typically, other processes are subsequently performed on the device 400. In one example, additional structures and devices are performed. In another example, bond wires are attached to the bond pad and a package lead to provide an external connection to the device 400.

It will be appreciated that while reference is made throughout this document to exemplary structures in discussing aspects of methodologies described herein (e.g., the structure presented in FIGS. 4A to 4E, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure includes a method of fabricating a semiconductor device. A semiconductor device includes a bond pad and a fuse layer. The bond pad includes a coating on an upper surface. A dielectric layer is formed over the bond pad and the fuse layer. A passivation layer is formed over the dielectric layer. An etch is performed to form a bond pad opening and a fuse opening. The etch is performed using only a single mask. The fuse opening defines a fuse window. The upper surface of the bond pad is exposed by substantially removing the coating from the upper surface of the bond pad.

The present disclosure also includes another method for fabricating a semiconductor device. A semiconductor device is provided. The device includes a bond pad and a fuse layer. The fuse layer is surrounded by a first dielectric layer. The bond pad is positioned on or over the first dielectric layer. The bond pad has a coating on an upper surface. A second dielectric layer is formed over at least the bond pad and the fuse layer. A passivation layer is formed over the second dielectric layer. A mask is formed over the passivation layer. The mask includes a bond pad opening and a fuse opening. A single etch is performed to simultaneously expose the coating on the bond pad and to leave a remaining portion of dielectric material on the fuse layer. The coating is substantially removed to expose the entire upper surface of the bond pad without removing at least a portion of the remaining dielectric material on the fuse layer.

The present disclosure also includes a semiconductor device. The device includes a fuse layer and a bond pad. The fuse layer is formed within a dielectric layer, such as oxide. The bond pad is formed on the dielectric layer. The bond pad includes an exposed entire upper surface from a coating removal process. A passivation layer is formed over the device. The passivation layer includes a bond pad opening over the bond pad and a fuse opening over the fuse layer. A remaining portion of dielectric material is present on the fuse layer. The remaining portion is not altered by the coating removal process.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of fabricating a semiconductor device, the method comprising:
    providing a semiconductor device having a bond pad arranged over a first dielectric layer and a fuse layer arranged within the first dielectric layer;
    forming a coating on an upper surface of the bond pad;
    forming a second dielectric layer over the bond pad;
    performing an etch using a mask to remove a portion of the second dielectric layer to form a bond pad opening and to thin a portion of the first dielectric layer to form a fuse opening, the fuse opening defining a fuse window; and
    exposing the upper surface of the bond pad by removing the coating on the upper surface of the bond pad by a solution having an etching selectivity that removes the coating and that does not substantially remove the first dielectric layer;
    wherein the second dielectric layer is formed along sidewall and upper surfaces of the bond pad and the coating, and does not overlie the fuse layer prior to performing the etch.

2. The method of claim 1, wherein forming the coating comprises depositing an anti-reflective coating.

3. The method of claim 1, wherein forming the coating comprises depositing Titanium-Nitride.

4. The method of claim 1, wherein exposing the upper surface is performed without a plasma etch.

5. The method of claim 1, wherein exposing the upper surface is obtained by utilizing the solution that facilitates removal of the coating.

6. The method of claim 5, wherein the solution includes hydrogen peroxide.

7. The method of claim 1, further comprising forming a passivation layer over the first dielectric layer.

8. The method of claim 7, wherein performing the etch comprises etching selected portions of the passivation layer and the first and second dielectric layers.

9. The method of claim 1, wherein the bond pad comprises a first conductive material and the fuse layer comprises a second conductive material.

10. The method of claim 1, further comprising forming the mask over the device prior to performing the etch.

11. The method of claim 1, further comprising removing the mask prior to exposing the upper surface of the bond pad.

12. The method of claim 1, wherein the etch is selective to the coating and omits etching at least a portion of the coating.

13. A method of fabricating a semiconductor device, the method comprising:
providing a semiconductor device having a bond pad and a fuse layer, the fuse layer surrounded by a first dielectric layer, the bond pad having a coating on an upper surface;
forming a second dielectric layer over the bond pad and the fuse layer;
forming a passivation layer over the second dielectric layer;
forming a mask having a bond pad opening and a fuse opening, the bond pad opening positioned above the bond pad and the fuse opening positioned above the fuse layer;
performing a single etch using the mask to simultaneously expose the coating on the bond pad and to leave a remaining portion of the second dielectric layer on the fuse layer;
removing the mask;
substantially removing the coating to expose the upper surface of the bond pad without leaving coating residue and without removing at least a portion of the remaining portion of the second dielectric layer on the fuse layer; and
removing the passivation layer after removing the coating.

14. The method of claim 13, wherein the coating is substantially removed by a solution which is selective to the coating.

15. The method of claim 13, wherein the coating is substantially removed by a solution which includes hydrogen peroxide.

16. The method of claim 13, wherein performing the single etch comprises etching through portions of the passivation layer defined by the bond pad opening and the fuse opening.

17. A method of fabricating a semiconductor device, the method comprising:
providing a semiconductor device having a first dielectric layer, wherein a first conductive body is arranged over the first dielectric layer and a second conductive body is arranged within the first dielectric layer;
forming a coating on an upper surface of the first conductive body;
forming a second dielectric layer over the first conductive body and the coating;
forming a mask over the first and second dielectric layers, wherein the mask leaves a surface of the second dielectric layer exposed;
performing an etch with the mask in place to remove a portion of the second dielectric layer to expose but not remove the coating on the upper surface of the first conductive body, and to thin a portion of the first dielectric layer over the second conductive body;
removing the mask after the etch; and
removing the coating from the upper surface of the first conductive body;
wherein the second dielectric layer is formed along sidewall and upper surfaces of the first conductive body and the coating, and not extended to overlie the second conductive body prior to performing the etch of the second dielectric layer.

18. The method of claim 17, wherein the coating on the upper surface of the first conductive body is entirely removed.

19. The method of claim 17, wherein the coating is removed from the upper surface of the first conductive body while leaving the first dielectric layer un-altered.

20. The method of claim 17, wherein forming the coating comprises depositing a titanium nitride layer.

* * * * *